US007746170B2

(12) United States Patent
Amini et al.

(10) Patent No.: US 7,746,170 B2
(45) Date of Patent: Jun. 29, 2010

(54) CLASS AB AMPLIFIER AND IMAGERS AND SYSTEMS USING SAME

(75) Inventors: Pezhman Amini, Pasadena, CA (US); Ali E. Zadeh, Sierra Madre, CA (US)

(73) Assignee: Micron Technology, Inc., Boise, ID (US)

( * ) Notice: Subject to any disclaimer, the term of this patent is extended or adjusted under 35 U.S.C. 154(b) by 508 days.

(21) Appl. No.: 11/800,459

(22) Filed: May 4, 2007

(65) Prior Publication Data

US 2008/0273106 A1 Nov. 6, 2008

(51) Int. Cl.
*H03F 3/45* (2006.01)
(52) U.S. Cl. ...................... 330/258; 330/255
(58) Field of Classification Search ............... 330/255, 330/258, 263, 264
See application file for complete search history.

(56) References Cited

U.S. PATENT DOCUMENTS 6,346,856 B1 * 2/2002 Myers et al. ............... 330/258

7,119,616 B2 * 10/2006 Benzer ...................... 330/255

OTHER PUBLICATIONS

Ramesh Jarjani, "*An Integrated Low-Voltage Class AB CMOS OTA*"; IEEE Journal of Solid State Circuits, vol. 34, No. 2, Feb. 1999; pp. 134-142.
Antonio J. Lopez-Martin, "*An Integrated Low-Voltage Class AB CMOS OTA*"; IEEE Journal of Solid State Circuits, vol. 40, No. 5, May 2005; pp. 1068-1077.

* cited by examiner

*Primary Examiner*—Khanh V Nguyen
(74) *Attorney, Agent, or Firm*—Dorsey & Whitney LLP

(57) ABSTRACT

A class AB amplifier includes an input stage having a pair of differential input terminals, first and second differential output terminals, and a local common mode feedback circuit. The input stage includes a local common mode feedback circuit having cascode transistor to achieve relatively high gain. The amplifier also includes an output stage having first and second pairs complementary transistors coupled between first and second power supply nodes. One of the complementary transistors in each pair has a gate coupled to the first and second differential output terminals, respectively. The output stage includes a pair of cascode transistor connected to one of the pairs of complementary output transistors. The amplifier can be used to supply a bias voltage to a highly capacitive load, such as voltage sampling capacitors in a CMOS imager.

23 Claims, 7 Drawing Sheets

CLASS AB AMPLIFIER AND IMAGERS AND SYSTEMS USING SAME

TECHNICAL FIELD

This invention relates generally to class AB amplifiers and methods, and, more particularly, to a class AB amplifier having improved performance characteristics, as well CMOS imagers and system using same.

BACKGROUND OF THE INVENTION

As is well-known in the art, class AB amplifiers are amplifiers containing circuits that are conductive only part of the time. As a result, class AB amplifiers generally have the advantage of using relatively little power. One prior art amplifier 10, which is described in an article entitled "An Integrated Low-Voltage Class AB CMOS OTA" by Ramesh Harjani, et al. and published in IEEE J. Solid-State, vol. 34, pp 134-142, February 1999, is shown in FIG. 1. The amplifier 10 is based on the principle of a self-biased input transistor. As shown in FIG. 1, two such NMOS transistors 12, 14 are combined in a common source configuration. The drains of the transistors 12, 14 are connected to the drains of respective NMOS transistors 16, 18, which have their gates connected to the gates of the transistors 12, 14, respectively. The transistors 16, 18 are connected to ground through respective current sinks 20, 22, and voltages VA, VB are generated at the sources of the transistors 16, 18, respectively. These voltages VA, VB are connected to an input of respective operational amplifiers 30, 32, which have their outputs connected to the gates of respective NMOS transistors 36, 38 that are connected in series with the transistors 12, 14. As further shown in FIG. 1, the transistors 12, 14 are connected in series with respective PMOS diode-connected transistors 40, 42, which have their gates coupled in current mirror fashion to respective transistor 46 and output transistor 48. The transistor 46 is, in turn, connected in series with a diode-connected NMOS transistor 50, and the output transistor 48 is connected in series with a diode-coupled output transistor 52, which have its gate coupled to the gate of the transistor 50. An output node 54 is formed at the interconnected drains of the transistors 48, 52.

In operation, when a differential input Vinp and Vinm, respectively, is zero, the voltages at the nodes designated VS, VA and VB are equal to common mode input voltage minus (VT+ΔV), where $\Delta V = \sqrt{2IB/K(W/L)}$ and VT is threshold voltage of the transistors 12, 14. Negative feedback ensures that the common source voltage of the transistors 12, 14 is always forced to track the smaller of the two voltages VA and VB, whereas VA and VB are (VT+ΔV) below Vinm and Vinp, respectively. More specifically, for example, if the input voltage Vinp is larger than the gate voltage Vinm, the voltage VB will be larger than VA. As a result, the output voltage of the operational amplifier 30 is effectively pulled down, which turns OFF the transistor 36. In such case, the current $I_1$ through the transistor 14 is given by the formula:

$$I_1 = \frac{1}{2}K\left(\frac{W}{L}\right)(Vinp - VS - VT)^2 \quad \text{(Equation 1)}$$

$$= \frac{1}{2}K\left(\frac{W}{L}\right)(Vinp - VA - VT)^2$$

where W/L is the channel width to length ratio of the transistor 14.

Further, using the relationship between VA and Vinm, i.e., $$Vinm = VA + \Delta V + VT \quad \text{(Equation 2)}$$

where VT is the threshold voltage of the transistor 16.

The above Equation 1 for the current through the transistor 14 can be written as:

$$I_1 = \frac{1}{2}K\left(\frac{W}{L}\right)(Vinp - Vinm + \Delta V)^2 \quad \text{(Equation 3)}$$

A slight difference between the input voltages Vinp and Vinm turns OFF one of the output transistors 46 or 48 and directs a large current, which is proportional to square of differential input voltage, Vinp−Vinm, to the other output transistor 48 or 46. The amplifier 10 is well suited for low-voltage applications. But, because all active loads are connected through diode-coupled transistors 46, 50 and 48, 52, the DC gain of the amplifier 10 is relatively low. As a result, the amplifier 10 is generally used only for low current application, which biases the transistors 46, 50 and 48, 52 to sub-threshold levels.

Attempts have been made to improve upon the amplifier 10 shown in FIG. 1 using an amplifier 60, which is shown in FIG. 2. This amplifier 60 is described in an article entitled "Low-Voltage Super Class AB CMOS OTA Cells With Very High Slew Rate and Power Efficiency" by Antonio J. Lopez-Martin, et al., which is published in IEEE J. Solid-State, vol. 40, pp 1068-1077, May 2005. The amplifier 60 includes a pair of PMOS input transistors 62, 64 receiving input voltages Vinm and Vinp, respectively. The transistors 62, 64 are coupled to ground through respective NMOS transistors 66, 68, which have their gates connected to each other and to their drains through respective feedback resistors 70, 72. A voltage "x" is generated at a node 74 formed by the interconnected drains of the transistors 62, 66, and a voltage "y" is generated at a node 76 formed by the interconnected drains of the transistors 64, 68. The voltage "x" is applied to the gate of an NMOS output transistor 80, which is connected in series with a diode-coupled PMOS transistor 82. Similarly, the voltage "y" is applied to the gate of an NMOS output transistor 84, which is connected in series with a PMOS transistor 86, which has its gate connected to the gate of the transistor 82. An output node 88 is formed at the interconnected drains of the transistors 84, 86. Finally, the respective sources and gates of the input transistors 62, 64 are connected to an adaptive biasing circuit 90, which is described in greater detail below.

In operation, the common mode voltage at the drain of the transistors 66, 68 is fed back to their common gates to provide additional current boosting. This technique is sometimes known as Local Common-Mode Feedback ("LCMFB"). The loads at the nodes 74, 76 where the voltages "x" and "y" are generated are approximately equal to the resistances of the feedback resistors 70, 72, respectively. Without the resistors 70, 72 the load at these nodes 74, 76 would be significantly smaller, i.e., on the order of $1/g_m$ of the transistors 66, 68. This increased impedance at the nodes 74, 76 increases the DC gain of the amplifier 60. Furthermore, if the amplifier 60 drives a large capacitive load, which is common in many applications, the dominant pole of the amplifier is determined by the capacitance and is independent of the impedance of the resistors 70, 72.

A prior art circuit 100 used for the adaptive biasing circuit 90 in the prior art amplifier 60 is shown in FIG. 3. For purposes of brevity and simplicity, only one-half the circuit is shown in FIG. 3 along with the PMOS transistor 62. The circuit 100 uses a pair of PMOS transistors 102, 104 connected in series with a current sink 106 between VCC and the drain of the transistor 62. The gate of the transistor 102 is connected to the node between the source of the transistor 104 and the current source 106, and the gate of the transistor 104 is connected to the gate of the input transistor 62, as also shown in FIG. 2.

A variety of techniques are used in the prior art to connect the circuit 100 shown in FIG. 3 with another of the circuits 100. However all of these exhibit a significant problem. Specifically, since the transistor 102 is diode-connected, and because the electrical characteristics of the transistor 62 should duplicate the electrical characteristics of the transistor 104, therefore the common mode input voltage must be precisely controlled. Otherwise, the transistors 62, 104 operate in their triode or ohmic region rather than in their amplification region, which would adversely impact the gain of the amplifier 60 using the circuit 100. Therefore, if the circuit 100 is used in the amplifier 60, and the amplifier 60 is used as an input buffer, the differential input voltage must be within a very small range to prevent the transistors 62, 104 from operating in their triode or ohmic region. Furthermore, the limits of the acceptable range varies with supply voltage, process variations, temperature and current supply.

There is therefore a need for a class AB amplifier that has the desirable attributes of the amplifiers 10, 60 without the above-described disadvantages.

DETAILED DESCRIPTION

Figure 4:
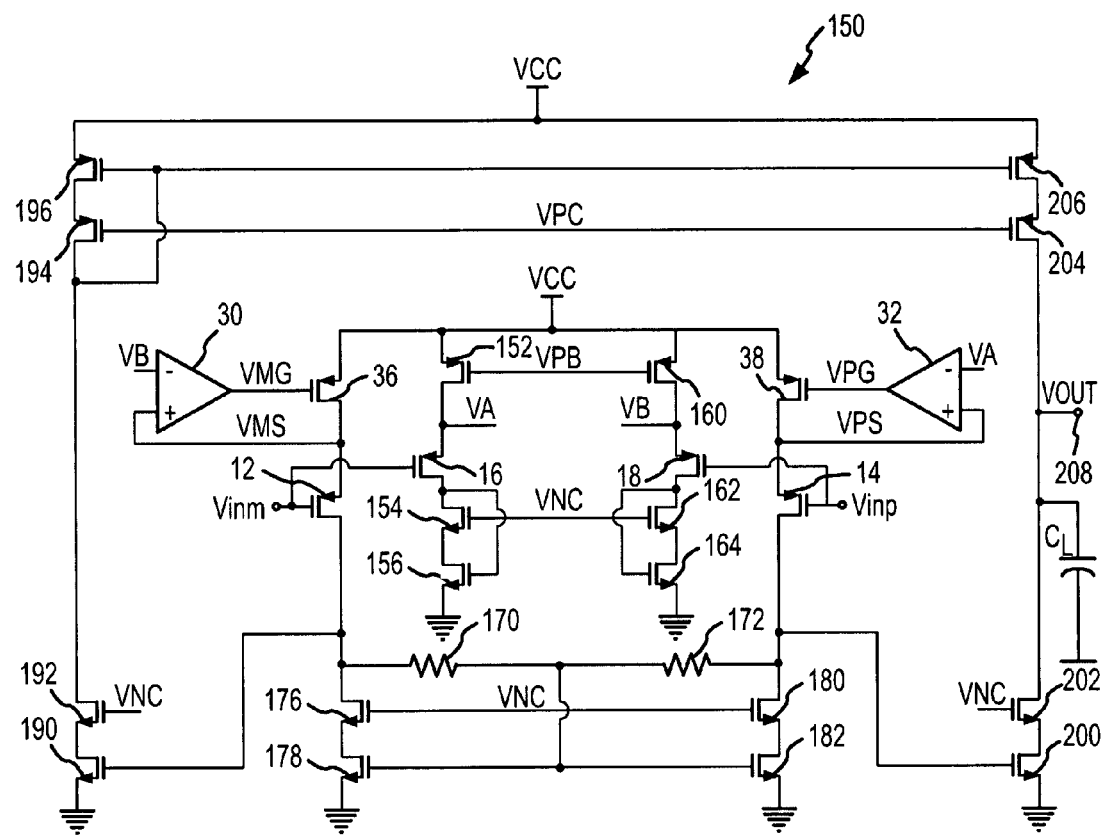
FIG. 4 is a schematic diagram of a class AB amplifier according to one embodiment of the invention.

A class AB amplifier 150 according to one embodiment of the invention is shown in FIG. 4. The amplifier 150 is implemented using PMOS and NMOS transistors. However, in other embodiments, NMOS transistors can be substituted for the PMOS transistors, and PMOS transistors can be substituted for the NMOS transistors, in which case a first voltage would be substituted for ground potential, and a second voltage having a magnitude less than the first voltage would be substituted for VCC. In other embodiments, components may be eliminated or modified, and additional components may be added, as will be apparent to one skilled in the art. In the interest of brevity, the components used in the amplifier 150 that are the same as the components used in the amplifier 60, or are simply reversals of transistor type (e.g., NMOS for PMOS) have been provided with the same reference numerals.

Figure 2:
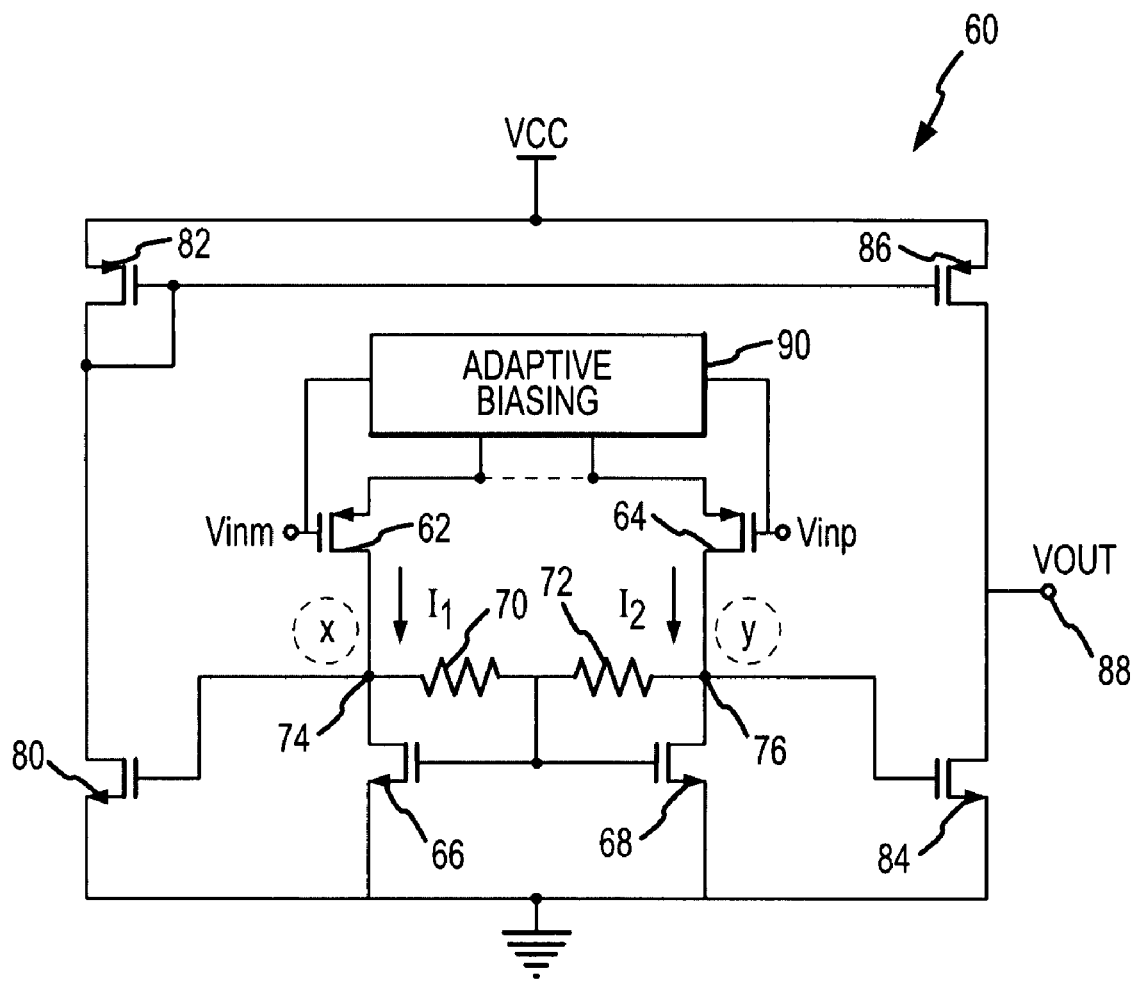
FIG. 2 is a schematic diagram of another embodiment of a prior art class AB amplifier.
Figure 3:
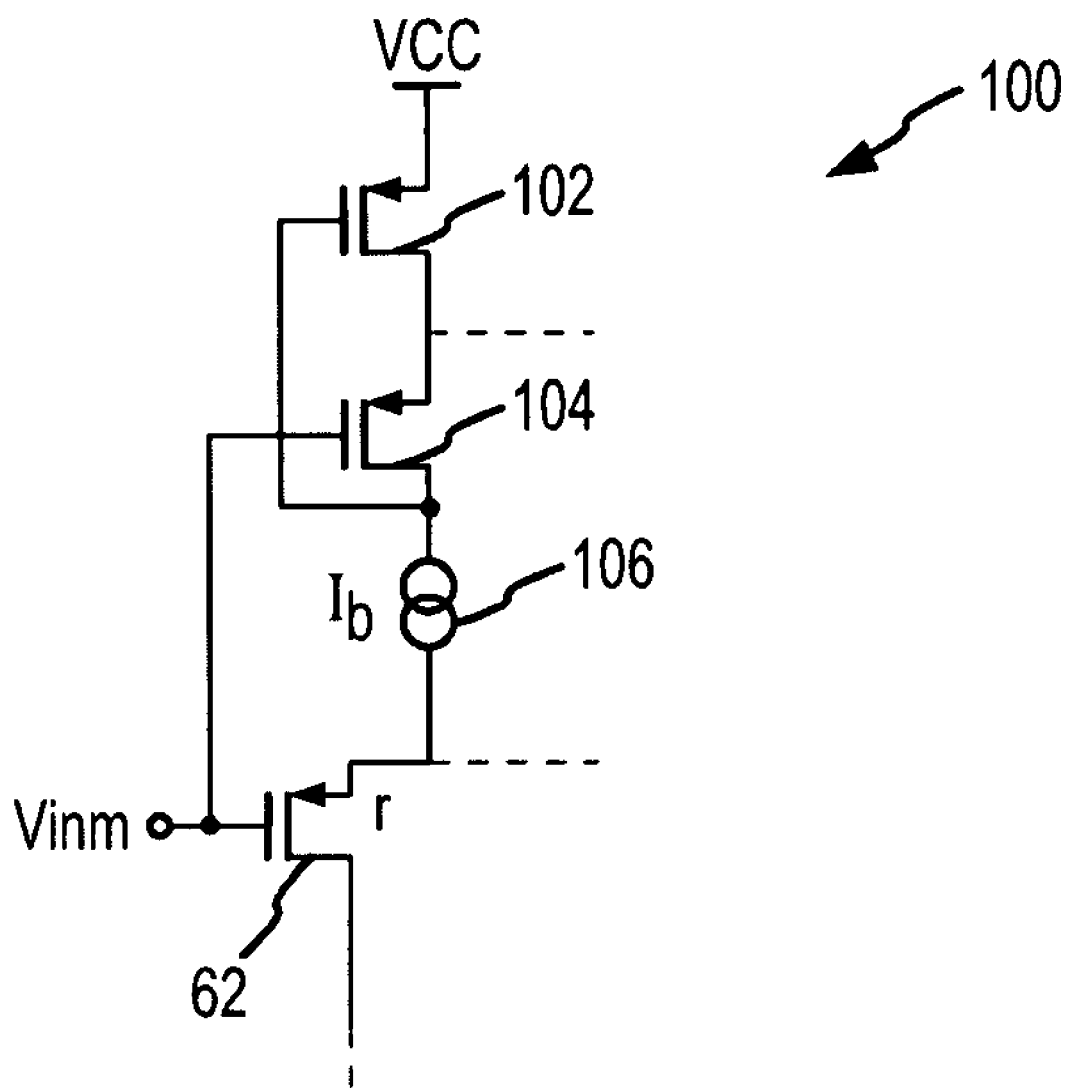
FIG. 3 is a schematic diagram of an embodiment of a prior art adaptive biasing circuit that can be used in the amplifier of FIG. 2.

The amplifier 150 includes a PMOS transistor 152 and two NMOS transistors 154, 156 for providing a constant bias current through the transistors 16. Similarly, a PMOS transistor 160 and two NMOS transistors 162, 164 are included for providing a constant bias current through the transistors 18. The gates of the transistors 152, 160 are connected to each other, and they receive the bias voltage VPB, which is provided by a bias circuit shown in FIG. 5. The NMOS transistors 154, 156 and 162, 162 are connected to each other in a manner similar to the adaptive bias circuit 100 shown in FIG. 3 except that the gates of the transistors 154, 162 are connected to each other rather than to the gates of the input transistors 12, 14 as shown in FIG. 3. The gates of the transistors 154, 162 receive a bias voltage VNC, which is also provided by a bias circuit shown in FIG. 5. Again, a pair of feedback resistors 170, 172 provides local common mode feedback, as explained above with reference to FIG. 2. The input transistor 12 is connected to ground through a pair of NMOS transistors 176, 178, and the input transistor 14 is connected to ground through a pair of NMOS transistors 180, 182. The gates of the transistors 176, 189 are connected to each other, and they also receive the bias voltage VNC that is applied to the gates of the transistors 154, 162. The gates of the transistors 178, 182 are connected to the feedback resistors 170, 172 in a manner that is somewhat similar to the manner in which the resistors 70, 72 are connected to the transistors 66, 68. However, the transistors 178, 182 are connected to the feedback resistors 170, 172 through the transistors 176, 180, respectively rather than directly as shown in FIG. 2.

Figure 1:
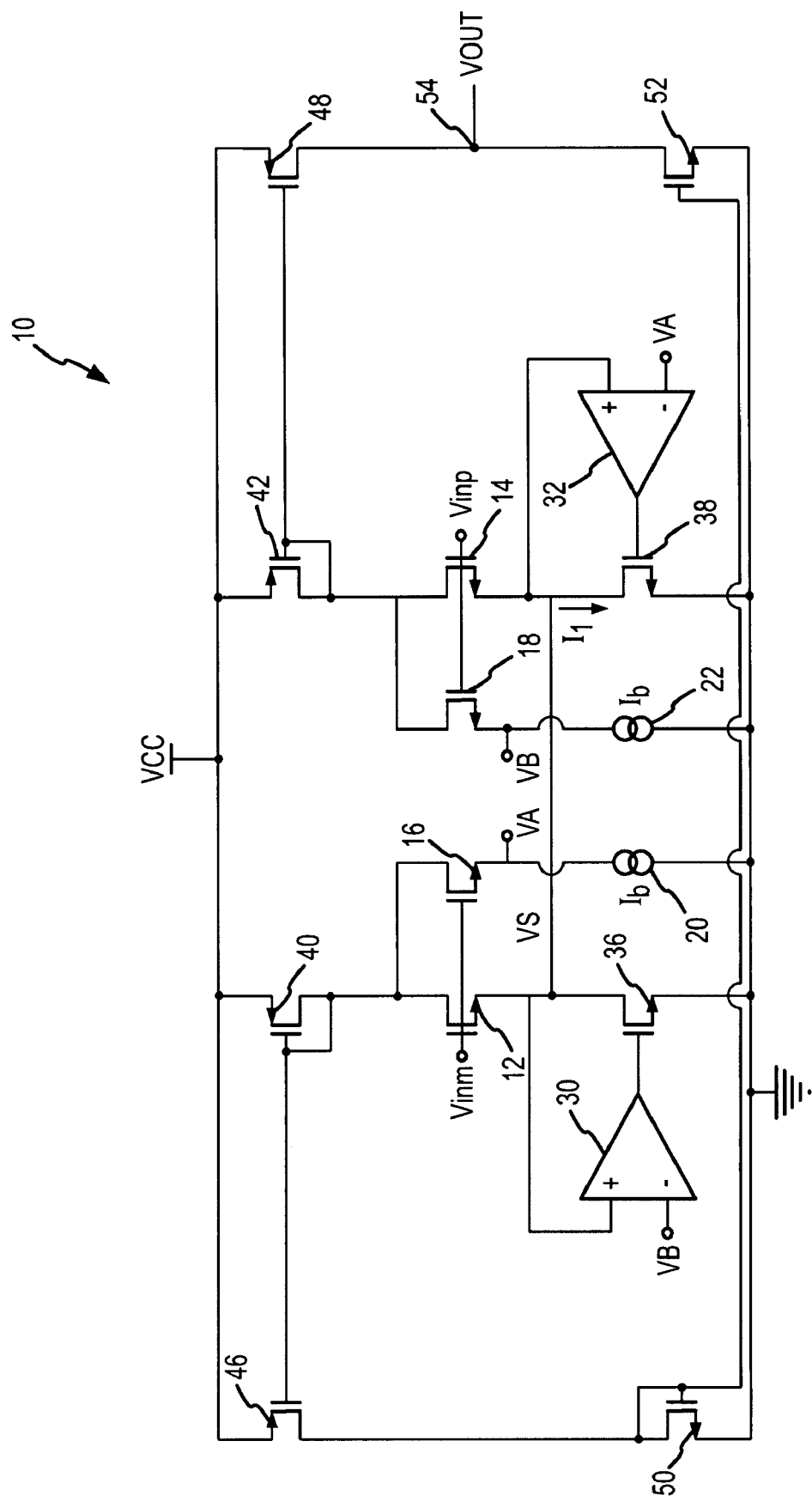
FIG. 1 is a schematic diagram of one embodiment of a prior art class AB amplifier.
Figure 5:
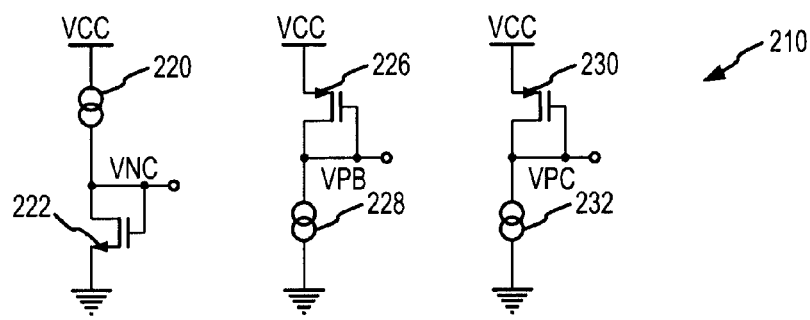
FIG. 5 is a schematic diagram of an embodiment of a bias circuit that may be used in the amplifier of FIG. 4.

The amplifier 150 also includes an output circuit that has some similarity to the output circuit used in the prior art amplifier 10 of FIG. 1. Specifically, the drain of the input transistor 12 is connected to the gate of an NMOS transistor 190, which is connected in series with another NMOS transistor 192 and two PMOS transistors 194, 196 between VCC and ground. The transistor 196 is diode connected through the transistor 194. In a similar manner, the drain of the input transistor 14 is connected to the gate of an NMOS transistor 200, which is connected in series with another NMOS transistor 202 and two PMOS transistors 204, 206 between VCC and ground. The PMOS transistor 206 is connected to the PMOS transistor 196 as a current mirror. The gates of the transistors 194, 204 receive a bias voltage VPC, which is also provided by a bias circuit as shown in FIG. 5, and the gates of the transistors 192, 202 receive the same bias voltage VNC that is applied to the gates of the transistors 176, 180 and 154, 162. An output node 208 is formed at the junction between the drain of the PMOS transistor 204 and the drain of the NMOS transistor 202. The transistors 206, 204, 202, and 200 preferably have a channel width-to-length ratio that is substantially larger than the width-to-length ratio of the other transistors in the amplifier, including the transistors 196, 194, 192, 190. As a result, the current that can be delivered to the output node 208 can be substantially greater than the current flowing through the transistors 196, 194, 192, 190.

A bias circuit 210 for generating the bias voltages VNC, VPB and VPC used in the amplifier 150 is shown in FIG. 5. The bias circuit 210 includes a current source 220 connected in series with a diode-connected NMOS transistor 222 between VCC and ground for generating the bias voltage VNC. A diode-connected PMOS transistor 226 is connected in series with a current sink 228 between VCC and ground for generating the bias voltage VPB. In the same manner, a diode-connected PMOS transistor 230 is connected in series with a current sink 232 between VCC and ground for generating the bias voltage VPC.

Returning to FIG. 4, in operation, assume for example that the magnitude of the input voltage Vinp to the amplifier 150 is again larger than the magnitude of the input voltage Vinm. As a result, the current flowing through the transistor 16 is greater than the current flowing through the transistor 18. Hence, the voltage VB applied to the operational amplifier 30 is greater than the voltage VA applied to the operational amplifier 32. Consequently, the voltage output by the amplifier 32 goes high to turn OFF the transistor 38. As a result, the magnitude of the current flowing through the transistor 14 greatly decreases. Meanwhile, because the voltage VB increases, the voltage output by the operational amplifier 30 decreases to increase the current flowing through the transistor 36. As a result, the magnitude of the current through the transistor 12 also increases.

This decreased current flowing through the transistor 14 causes the voltage applied to the NMOS transistor 200 to greatly decrease. As a result, very little current can be conducted through the transistors 202, 200. However, the increased current flowing though the transistor 12 increases the voltage applied to the + input of the amplifier 30, thereby causing the voltage at the output of the amplifier 30 to increase. Ultimately, the voltage at the output of the amplifier 30 reaches the voltage VB. Because the transistor 36 remains ON, the feedback loop through operational amplifier 30 is not broken so that the voltage applied to the amplifier 30 remains equal to the voltage VB. The increased current flowing through the transistor 12 also increases the voltage applied to the NMOS transistor 190, so the current flowing through the NMOS transistor 192 and the diode-connected PMOS transistor 196 greatly increases. As mentioned above, the PMOS output transistor 206 acts as a current mirror with the PMOS transistor 196. However, the relatively large channel width-to-length ratio of the transistors 206, 204, 202, 200, which may be on the order of 500 times larger than the width-to-length ratio of the other transistors in the amplifier 150, causes the transistors 206, 204 to supply a current that is substantially greater than the current flowing through the PMOS transistor 196. As a result, the amplifier 150 can supply a very large current to the output node 208. This differential between the small current flowing through the transistors 196, 194 and the large current flowing through the transistors 202, 200 quickly charges a capacitive load, which is represented by the capacitor CL in FIG. 4. As a result, the voltage at the output node 208 quickly increases. The amplifier 150 operates in a complementary manner for a differential input in which the input voltage Vinp is greater than the input voltage Vinm.

Although the amplifier 150 has some similarities to the amplifiers 10, 60 shown in FIGS. 1 and 2, it has several differences that cause it to have much improved performance. First, the cascode configuration of the load transistors 206, 204 and 202, 200 increases the impedance at the output node 208 thereby improving the DC gain of the amplifier 150. While the cascode transistors 194, 192 are not required, they result in a more balanced amplifier and reduces the operation amplifier offset. Second, the input transistors 12, 14 do not have their sources connected to each other as they do in the amplifier 10. As a result, one of the input transistors 12 or 14 is turned OFF for small differential input voltages. If the input transistors 12, 14 were common-source connected, one of the input transistors 12 or 14 would continue to conduct current. For example, if the input voltage Vinp was slightly larger than the input voltage Vinm, some of the current flowing through the transistor 36 would flow through the transistor 14, since the source of the transistor 14 would be connected to the source of the transistor 12. In contrast, by using the configuration shown in FIG. 4, all of the current flowing through the transistor 36 flows through the transistor 12. As a result, for a small differential input voltage of a give magnitude, the DC gain of the amplifier 150 is greater. Third, the local common-mode feedback provided by the resistors 170, 172 is used with cascade transistors 176, 180, which greatly increases the load impedance of the transistors 12, 14. This increased load impedance substantially increases the gain of the transistors 12, 14. If the transistors 176, 180 were not used, as with the amplifier 60 shown in FIG. 2, the load impedance of the transistors 12, 14 would be substantially small, thus resulting in significantly less gain. Finally, the acceptable range of the common mode input voltage of the amplifier 150 is independent of variations in the magnitude of the supply voltage VCC.

Figure 6:
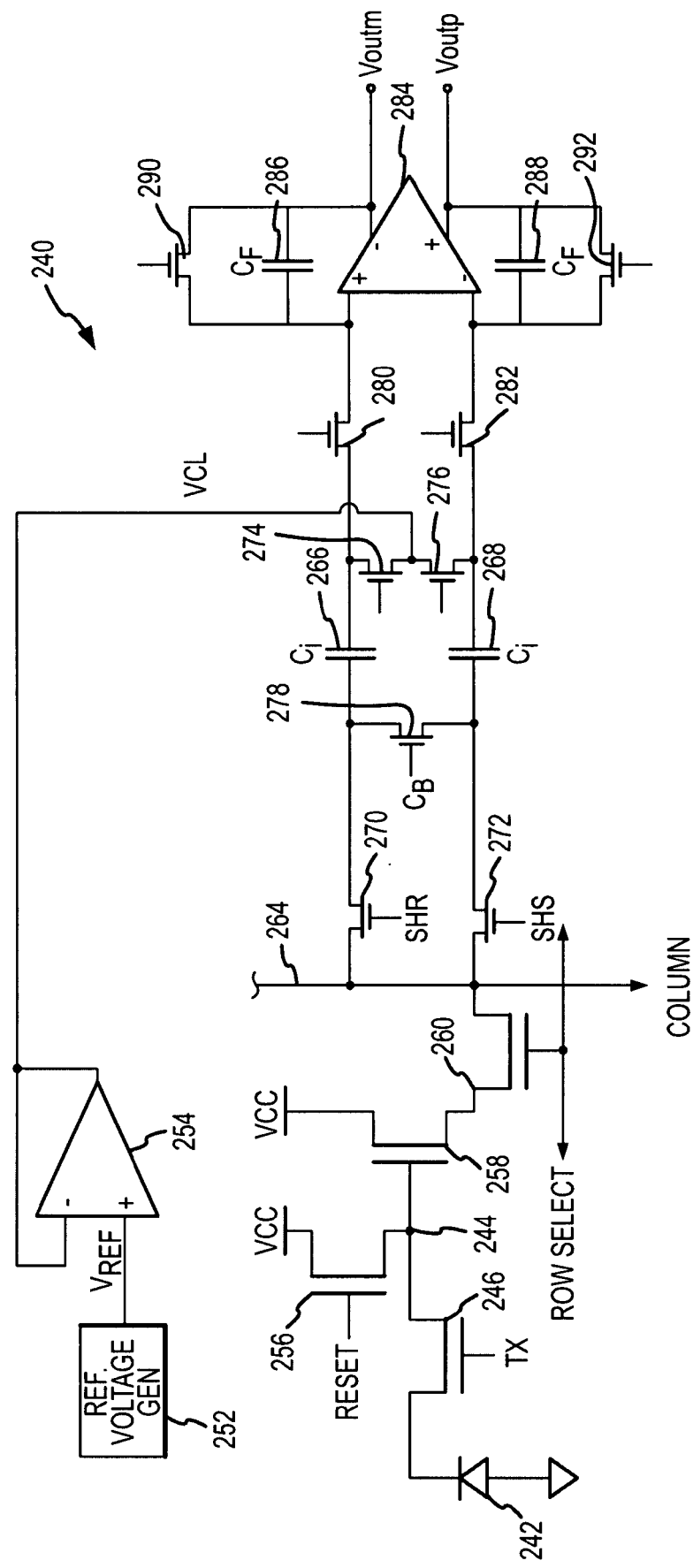
FIG. 6 is a schematic diagram of an embodiment of a CMOS imager pixel that is connected to the amplifier of FIG. 4 or some other embodiment of the invention.

The high output current capability of the amplifier 150 and other embodiments of the invention make it ideally suited to driving highly capacitive loads. For example, the amplifier 150 may be used to maintain plates of voltage sampling capacitors of a CMOS imager at a precisely controlled voltage. With reference to FIG. 6, a CMOS four transistor imager pixel 240 includes a photosensor 242 (e.g., photodiode, photogate, etc.), coupled to a floating diffusion node 244 by a transfer transistor 246. The CMOS imager pixel 240 also includes an NMOS reset transistor 256 that selectively charges the floating diffusion node 244 to a suitable voltage, such as VCC, before an image is to be obtained. The voltage to which the floating diffusion node 244 is charged before and after the photosensor 242 is exposed to create an image is coupled through an NMOS source follower transistor 258 to an NMOS row select transistor 260. When the transistor 260 is turned ON, the voltage of the floating diffusion node 244 less the threshold voltage of the source follower transistor 258 is applied to a column line 264.

The column line 264 is connected to a pair of capacitors 266, 268 of equal capacitances through a pair of transistors 270, 272. During a sampling period, the gate of the transistor 270 receives a signal SHR to store a reset voltage of the pixel 240 on the capacitor 266. Similarly, the gate of the transistor 272 receives a signal SHS to store a sample voltage of the pixel 240 on the capacitor 268. At the same time, transistors 274, 276 are turned ON to apply a column voltage VCL to the opposite terminals of the capacitors 266, 268. Additionally, transistors 278, 280, 282 are turned OFF. The capacitor 266 is therefore charged to a voltage equal to the difference between the reset voltage and VCL, and the capacitor 268 is charged to a voltage equal to the difference between the signal voltage and VCL.

During a subsequent conversion period, the transistors 270, 272, 274, 276 are turned OFF, and transistors 278, 280, 282 are turned ON. The voltage to which the capacitor 266 is charged is then applied to the "+" input of a differential amplifier 284, and the voltage to which the capacitor 268 is charged is applied to the "−" input of a differential amplifier 284, which may have a unity gain. The differential voltage applied to the amplifier 284 corresponds to the difference between the signal voltage and the reset voltage of the pixel 240. Feedback capacitors 286, 288 of equal capacitances set the gain of the amplifier 284 to the ratio of the capacitance of the capacitors 266, 268 to the capacitance of the capacitors 286, 288. NMOS transistors 290, 292 are connected in parallel with the capacitors 286, 288, respectively. The transistors 290, 292 are turned ON to discharge the capacitors 286, 288, respectively, during the sampling period, and they are turned OFF during the conversion period.

In operation, the photosensor 242 is connected to the floating diffusion node 244 by the transfer transistor 246 when the transfer transistor 246 is turned ON by a control signal TX. A reset control signal RESET then turns ON the reset transistor 256 to reset the photosensor 242 and floating diffusion node 244 to a suitable voltage, such as VCC, as is known in the art. The source follower transistor 258 converts the charge stored by the floating diffusion node 244 into an electrical output voltage signal. The row select transistor 260 is controllable by a row select signal ROW SELECT for selectively connecting the source follower transistor 258 and its output voltage signal to the column line 264 of a pixel array. The transistor 272 is then turned ON during the sampling period to store the reset voltage on the capacitor 266, as explained above.

After the reset transistor 256 has been turned OFF, the photosensor 242 is exposed to obtain an image. The charge of the floating diffusion node 244 then changes. The source follower transistor 258 again converts the charge stored by the floating diffusion node 244 into an electrical output voltage signal, which is applied to the column line 264 through the source follower transistor 258 and the row select transistor 260. The transistor 272 is then turned ON to store a voltage on the capacitor 268 corresponding to the pixel image intensity on the capacitor 268, as also explained above. During this time, the capacitors 286, 288 are discharged by the transistors 286, 288 being turned ON.

The capacitors are then isolated from the column line 264 during the conversion period by the transistors 270, 272 being turned OFF. The transistor 278 is then turned ON so that the differential voltage to which the capacitors 266, 268 have been charged is applied to the amplifier 284 through the ON transistors 280, 282. The amplifier 284 then outputs a differential image signal Voutm, Voutp corresponding to the intensity of a corresponding pixel of the image.

As further shown in FIG. 6 and as explained above, the column voltage VCL is applied to the terminals of the capacitors 266, 268. The voltage VCL, which is normally half the supply voltage (i.e., VCC/2), is controlled by the output of an amplifier 254, which may be the amplifier 150 shown in FIG. 4 or some other embodiment of the invention. One differential input of the amplifier 254 receives a reference voltage $V_{REF}$ from a reference voltage source 252. The magnitude of the reference voltage is typically one-half the magnitude of a supply voltage VCC, i.e., VCC/2. The other of differential input of the amplifier is connected to the output of the amplifier 254 so that the amplifier 254 functions as a voltage follower. The load on the amplifier 254 is highly capacitive because of the large number of capacitors 266, 268 coupled to the correspondingly large number of column lines 264. The advantageous performance characteristics of the amplifier 254 as described above allow it to maintain this highly capacitive load at VCC/2.

Figure 7:
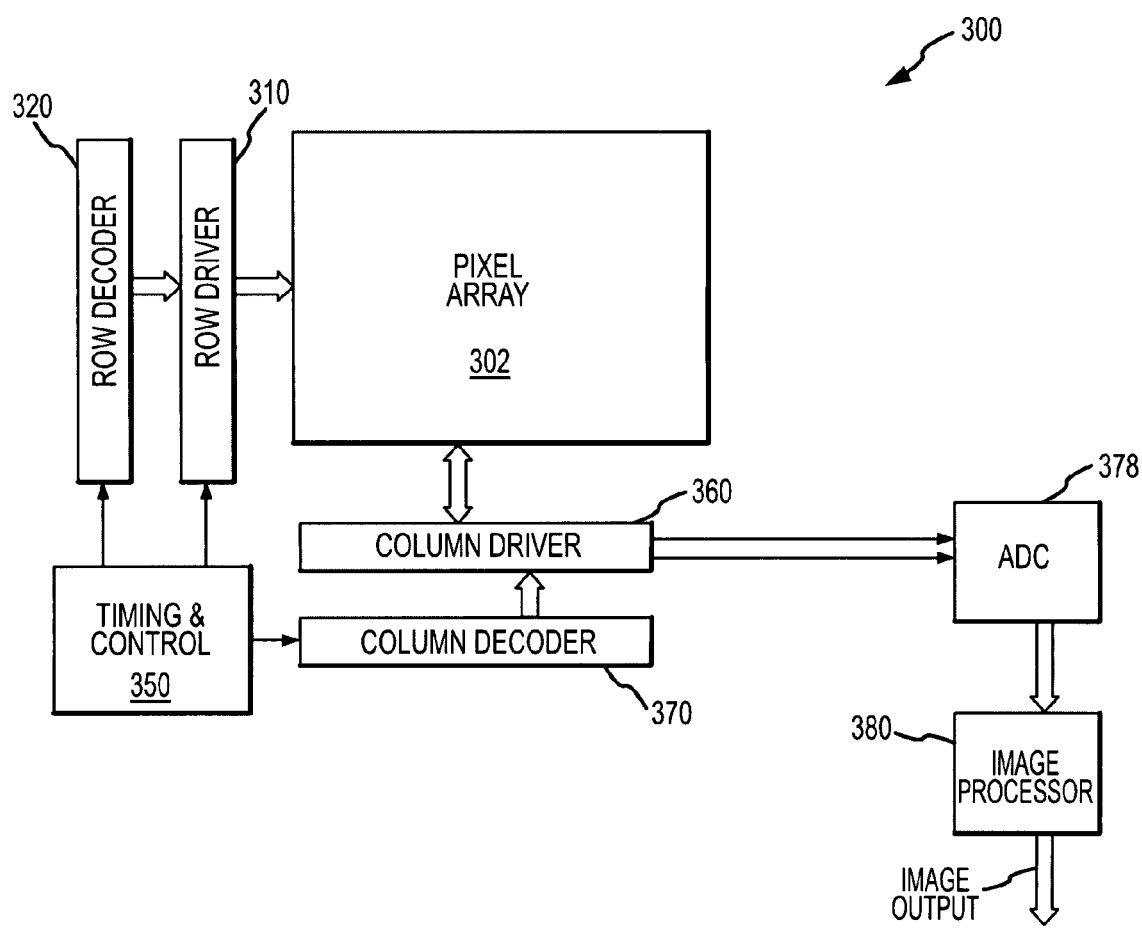
FIG. 7 is a block diagram of an embodiment of a CMOS imager device using the imager pixels of FIG. 6 or imager pixels according to some other embodiment of the invention.

A CMOS imager device 300 having an array 302 of the imager pixels 240 is shown in FIG. 7. The pixel array 302 comprises a plurality of pixels arranged in a predetermined number of columns and rows (not shown). The pixels 240 (FIG. 6) of each row in array 302 are all turned on at the same time by a row select line, and the pixels 240 of each column are selectively output by respective column select lines. A plurality of row and column lines is provided for the entire array 302. The row lines are selectively activated in sequence by a row driver 310 in response to row address decoder 320. The column select lines are selectively activated in sequence for each row activation by a column driver 360 in response to column address decoder 370. Thus, a row and column address is provided for each pixel 240.

The CMOS imager 300 is operated by a timing and control circuit 350, which controls the address decoders 320, 370 for selecting the appropriate row and column lines for pixel readout. The timing and control circuit 350 also controls the row and column driver 310, 360 so that they apply driving voltages to the drive transistors of the selected row and column lines. The column driver 360 outputs differential pixel image signal Voutp–Voutn, which is digitized by an analog-to-digital converter 378. The digitized pixel signals are applied to an image processor 380 to form a digital image signals. The digitizing and image processing can be located on or off the same semiconductor substrate as the imager device 300.

Figure 8:
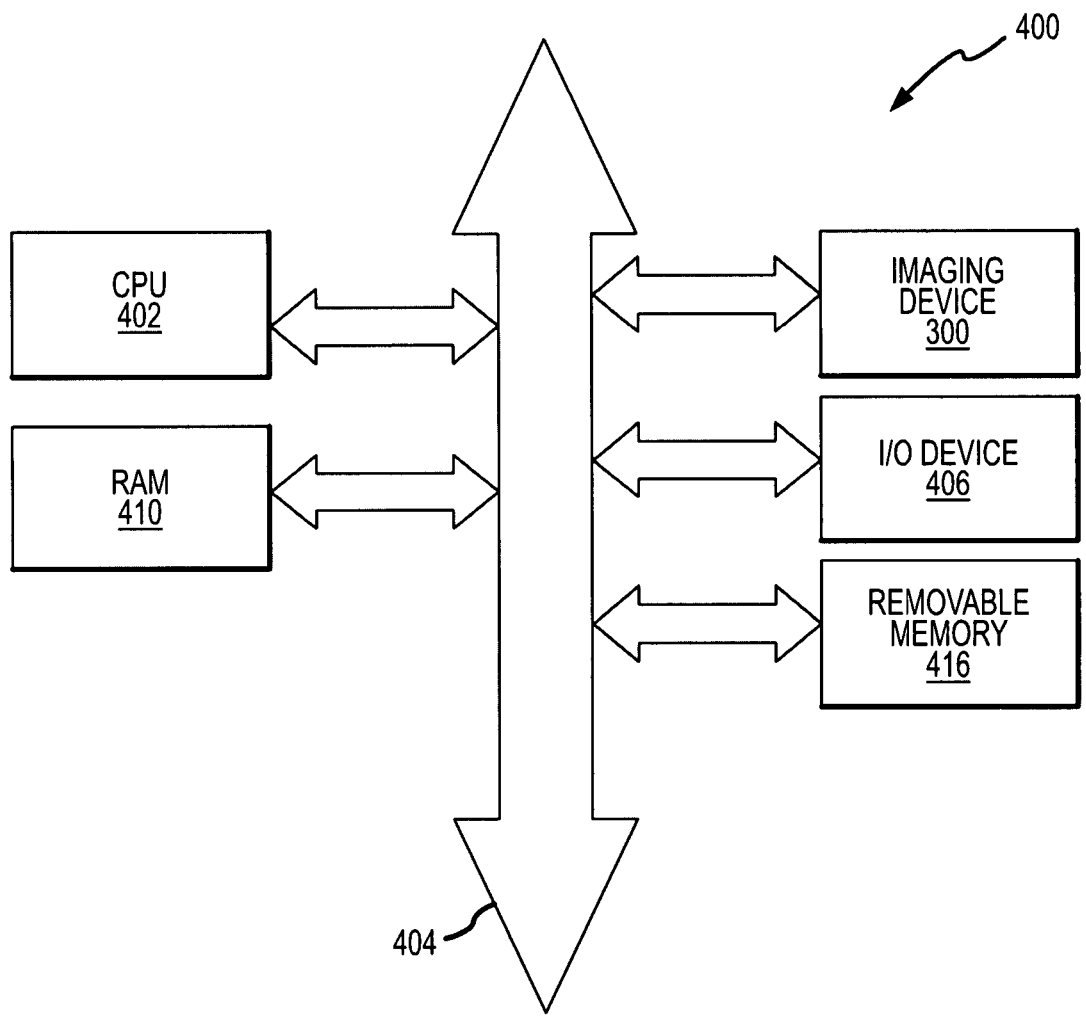
FIG. 8 is a block diagram of an embodiment of a processor-based system using the CMOS image device of FIG. 7 or a CMOS imager device according to some other embodiment of the invention.

The imager device 300 can be used in a wide variety of systems, including the embodiment of a processor-based system 400 shown in FIG. 8. The processor-based system 400, which may be, for example, a camera system, includes a central processing unit ("CPU") 402, such as a microprocessor, that communicates with an input/output ("I/O") device 406 over a bus 404. The imaging device 300 also communicates with the CPU 402 over the bus 404. The processor-based system 400 also includes random access memory ("RAM") 410, and can include removable memory 416, such as flash memory, that also communicate with CPU 402 over the bus 404. The imaging device 300 may be combined with a processor, such as a CPU, digital signal processor, or microprocessor, with or without memory storage on a single integrated circuit or on a different chip than the processor.

The processor-based system 400 shown in FIG. 8 is just one of many examples of a system having digital circuits that could include the image sensor device 300. Without being limiting, such a system could include a computer system, camera system, scanner, machine vision, vehicle navigation, video phone, surveillance system, auto focus system, star tracker system, motion detection system, image stabilization system, and data compression system.

From the foregoing it will be appreciated that, although specific embodiments of the invention have been described herein for purposes of illustration, various modifications may be made as will be apparent to one skilled in the art. For example, although the amplifier 150 shown in FIG. 4 receives differential input signals Vinp and Vinm, it will be understood that the gate of one of the input transistors 12, 14 may receive a reference voltage or some other voltage, and a single input may be applied to the amplifier 150. Accordingly, the invention is not limited except as by the appended claims.

What is claimed is:

1. An amplifier, comprising:

an input stage receiving an input signal, the input stage having a first output node on which a first voltage is generated that varies directly with the magnitude of the input signal and a second output node on which a second voltage is generated that varies inversely with the magnitude of the input signal; and an output stage coupled to the input stage, the output stage comprising:

a first transistor and a second transistor connected in series with each other between first and second voltage nodes, the second transistor being complementary to the first transistor, the first transistor having a gate that is coupled to one of the output nodes of the input stage;

a third transistor of the same type as the first transistor and a fourth transistor of the same type as the second transistor connected in series with each other between third and fourth voltage nodes, the third transistor having a gate that is coupled to the other of the output nodes of the input stage, the fourth transistor being connected to the second transistor as a current mirror;

a first cascode transistor coupled between the third transistor and the fourth transistor, the first cascode transistor being of the same type as the third transistor, and a second cascode transistor coupled between the fourth transistor and the third transistor, the second cascode transistor being of the same type as the fourth transistor.

2. The amplifier of claim 1, further comprising:

a third cascode transistor coupled between the first transistor and the second transistor, the third cascode transistor being of the same type as the first transistor, and a fourth cascode transistor coupled between the second transistor and the first transistor, the fourth cascode transistor being of the same type as the second transistor.

3. The amplifier of claim 2 wherein the second transistor is diode-coupled through the fourth cascode transistor.

4. The amplifier of claim 1 wherein the first stage includes a local common-mode feedback circuit.

5. The amplifier of claim 4, wherein the input stage comprises first and second input transistors, and wherein the local common-mode feedback circuit comprises:
a first common-mode feedback transistor coupled in series with the first input transistor;
a second common-mode feedback transistor coupled in series with the second input transistor;
a first resistor coupled between gates of the first and second common-mode feedback transistors and a junction between the first input transistor and the first common-mode feedback transistor; and
a second resistor coupled between gates of the first and second common-mode feedback transistors and a junction between the second input transistor and the second common-mode feedback transistor.

6. The amplifier of claim 5, further comprising:
a third cascode transistor coupled between the first common-mode feedback transistor and the first input transistor, the third cascode transistor being of the same type as the first common-mode feedback transistor, and
a fourth cascode transistor coupled between the second common-mode feedback transistor and the second input transistor, the fourth cascode transistor being of the same type as the second common-mode feedback transistor.

7. The amplifier of claim 1 wherein the third and fourth transistors have channel width-to-length ratios that are substantially larger than width-to-length ratios of the first and second transistors.

8. An amplifier, comprising:
an input stage receiving an input signal, the input stage comprising:
a first input transistor having a gate coupled to receive a first input signal;
a second input transistor having a gate coupled to receive a second input signal;
a common mode feedback circuit coupled to the first and second input transistors, the common mode feedback circuit comprising:
a first feedback transistor having a source coupled to a voltage node;
a first feedback resistor coupled between a gate of the first feedback transistor and a drain of the first input transistor;
a second feedback transistor having a source coupled to a voltage node and a gate coupled to the gate of the first feedback transistor;
a second feedback resistor coupled between a gate of the second feedback transistor and a drain of the second input transistor;
a first cascode transistor coupled between a drain of the first feedback transistor and the drain of the first input transistor;
a second cascode transistor coupled between a drain of the second feedback transistor and the drain of the second input transistor; and
an output stage coupled to the input stage, the output stage having differential first and second input terminals, the first input terminal coupled to the drain of the first input transistor and the second input terminal coupled to the drain of the second input transistor.

9. The amplifier of claim 8, further comprising:
a third transistor coupled between a source of the first input transistor and a power supply node;
a fourth transistor coupled between a source of the second input transistor and a power supply node;
a differential input circuit coupled to receive the first input signal and the second input signal, the differential input circuit being operable to generate first and second differential output signals corresponding thereto;
a first differential amplifier having an output coupled to a gate of the third transistor, a first differential input coupled to receive the first differential output signal and a second differential input coupled to the source of the first input transistor; and
a second differential amplifier having an output coupled to a gate of the fourth transistor, a first differential input coupled to receive the second differential output signal and a second differential input coupled to the source of the second input transistor.

10. The amplifier of claim 9 wherein the differential input circuit comprises:
a fifth transistor having a gate coupled to receive the first input signal;
a sixth transistor having a gate coupled to receive the second input signal;
a seventh transistor coupled between the fifth transistor and a power supply node, the first differential output voltage being generated at a junction between the seventh transistor and the fifth transistor; and
an eighth transistor coupled between the sixth transistor and a power supply node, the second differential output voltage being generated at a junction between the eighth transistor and the sixth transistor.

11. An amplifier, comprising:
an input stage having a pair of differential input terminals, first and second differential output terminals, and a local common mode feedback circuit; and
an output stage having first and second complementary transistors coupled between first and second power supply nodes, one of the first and second complementary transistors having a gate coupled to the first differential output terminal, the output stage further having third and fourth complementary transistors coupled between the first and second power supply nodes, one of the third and fourth complementary transistors having a gate coupled to the second differential output terminal, the output stage further having a first cascode transistor connected to the third complementary transistor, a second cascode transistor connected to the fourth complementary transistors a third cascode transistor connected to the first complementary transistor and a fourth cascode transistor connected to the second complementary transistor.

12. The amplifier of claim 11, wherein a gate of the first complementary transistor is coupled to the first differential output terminal, and a gate of the third complementary transistor is coupled to the second differential output terminal.

13. The amplifier of claim 12 wherein the fourth complementary transistor is connected to the second complementary transistor as a current mirror so that the current flowing through the fourth complementary transistor mirrors the current flowing through the second complementary transistor.

14. The amplifier of claim 11 wherein the third and fourth complementary transistors have channel width-to-length ratios that are substantially larger than channel width-to-length ratios of the first and second complementary transistors.

15. A CMOS imager pixel, comprising:
a photosensor;
a pixel circuit coupled to the photosensor, the pixel circuit being operable to apply a signal indicative of light received by the photosensor to a column line;
a capacitor having first and second terminals, the first terminal of the capacitor being coupled by a transistor to the column line;
a reference voltage generator structured to produce a reference voltage at an output terminal;
an amplifier having an output terminal coupled to the second terminal of the capacitor, a first input terminal coupled to the output terminal of the reference voltage generator, and a second input terminal coupled to the output terminal of the amplifier, the amplifier comprising:
an input stage receiving an input signal, the input stage having a first output node on which a first voltage is generated that varies directly with the magnitude of the input signal and a second output node on which a second voltage is generated that varies inversely with the magnitude of the input signal;
an output stage coupled to the input stage, the output stage comprising:
a first transistor and a second transistor connected in series with each other between first and second voltage nodes, the second transistor being complementary to the first transistor, the first transistor having a gate that is coupled to one of the output nodes of the input stage;
a third transistor of the same type as the first transistor and a fourth transistor of the same type as the second transistor connected in series with each other between third and fourth voltage nodes, the third transistor having a gate that is coupled to the other of the output nodes of the input stage, the fourth transistor being connected to the second transistor as a current mirror;
a first cascode transistor coupled between the third transistor and the fourth transistor, the first cascode transistor being of the same type as the third transistor, and
a second cascode transistor coupled between the fourth transistor and the third transistor, the second cascode transistor being of the same type as the fourth transistor.

16. The CMOS imager pixel of claim 15, further comprising:
a third cascode transistor coupled between the first transistor and the second transistor, the third cascode transistor being of the same type as the first transistor, and
a fourth cascode transistor coupled between the second transistor and the first transistor, the fourth cascode transistor being of the same type as the second transistor.

17. The CMOS imager pixel of claim 16 wherein the second transistor is diode-coupled through the fourth cascode transistor.

18. The CMOS imager pixel of claim 15 wherein the first stage includes a local common-mode feedback circuit.

19. The CMOS imager pixel of claim 18, wherein the input stage comprises first and second input transistors, and wherein the local common-mode feedback circuit comprises:
a first common-mode feedback transistor coupled in series with the first input transistor;
a second common-mode feedback transistor coupled in series with the second input transistor;
a first resistor coupled between gates of the first and second common-mode feedback transistors and a junction between the first input transistor and the first common-mode feedback transistor; and
a second resistor coupled between gates of the first and second common-mode feedback transistors and a junction between the second input transistor and the second common-mode feedback transistor.

20. The CMOS imager pixel of claim 19, further comprising:
a third cascode transistor coupled between the first common-mode feedback transistor and the first input transistor, the third cascode transistor being of the same type as the first common-mode feedback transistor, and
a fourth cascode transistor coupled to the second common-mode feedback transistor between the second common-mode feedback transistor and the second input transistor, the fourth cascode transistor being of the same type as the second common-mode feedback transistor.

21. The CMOS imager pixel of claim 15 wherein the third and fourth transistors have channel width-to-length ratios that are substantially larger than width-to-length ratios of the first and second transistors.

22. An amplifier, comprising:
an input stage having a pair of differential input terminals, first and second differential output terminals, and a local common mode feedback circuit; and
an output stage having first and second complementary transistors coupled between first and second power supply nodes, the first complementary transistor having a gate coupled to the first differential output terminal, the output stage further having third and fourth complementary transistors coupled between the first and second power supply nodes, the third complementary transistor having a gate coupled to the second differential output terminal, the output stage further having a first cascode transistor connected to the third complementary transistor and a second cascode transistor connected to the fourth complementary transistor, the fourth complementary transistor being connected to the second complementary transistor as a current mirror so that the current flowing through the fourth complementary transistor mirrors the current flowing through the second complementary transistor.

23. The amplifier of claim 22 wherein the third and fourth complementary transistors have channel width-to-length ratios that are substantially larger than channel width-to-length ratios of the first and second complementary transistors.

* * * * *

UNITED STATES PATENT AND TRADEMARK OFFICE
CERTIFICATE OF CORRECTION

PATENT NO.        : 7,746,170 B2
APPLICATION NO.   : 11/800459
DATED             : June 29, 2010
INVENTOR(S)       : Pezhman Amini et al.

It is certified that error appears in the above-identified patent and that said Letters Patent is hereby corrected as shown below:

In column 10, lines 50-51, in Claim 11, delete "transistors" and insert -- transistor, --, therefor.

Signed and Sealed this

Fourteenth Day of September, 2010

David J. Kappos
*Director of the United States Patent and Trademark Office*